United States Patent [19]

Wilkinson

[11] Patent Number: 4,569,051
[45] Date of Patent: Feb. 4, 1986

[54] METHODS OF CORRECTING ERRORS IN BINARY DATA

[75] Inventor: James H. Wilkinson, Basingstoke, United Kingdom

[73] Assignee: Sony Corporation, Tokyo, Japan

[21] Appl. No.: 518,136

[22] Filed: Jul. 28, 1983

[30] Foreign Application Priority Data

Aug. 6, 1982 [GB] United Kingdom ............... 8222767

[51] Int. Cl.$^4$ ............................................. G06F 11/12
[52] U.S. Cl. ...................................... 371/37; 371/39
[58] Field of Search ............... 371/38, 37, 39, 40

[56] References Cited

U.S. PATENT DOCUMENTS

3,418,630 12/1968 Van Duuren ............. 371/39
4,151,510 4/1979 Howell et al. ............ 371/40
4,336,612 6/1982 Inoue et al. ............... 371/39
4,356,564 10/1982 Doi et al. .................. 371/40
4,413,339 11/1983 Riggle et al. ............. 371/38

Primary Examiner—Michael R. Fleming
Attorney, Agent, or Firm—Lewis H. Eslinger; Alvin Sinderbrand

[57] ABSTRACT

A method of correcting errors in binary data comprises associating with each block of data words a plurality of check words for use in error detection and correction, each check word being derived in dependence on all the data words in the block and each other check word associated with the block. One check word may be derived by an exclusive-OR addition and the other or others may be derived using a primitive polynominal generator.

10 Claims, 13 Drawing Figures

METHODS OF CORRECTING ERRORS IN BINARY DATA

BACKGROUND OF THE INVENTION

1. Field of the Invention

This invention relates to methods of correcting errors in binary data, and particularly, but not exclusively, to methods of correcting errors in digital television signals after recording and reproduction.

2. Description of the Prior Art

It is now quite common for analog signals, such as audio on television signals, to be put into digital form, for example using pulse code modulation, for transmission or for recording. It is also quite usual to add some check words to the coded data words before transmission or recording for use on reception or reproduction to detect and correct errors in the received or reproduced data words. Sometimes the check words are derived quite simply as, for example, in the case of simple parity check words and cyclic redundancy check words. However, such simple methods generally imply a relatively low level of error detection or correction capability, or alternatively that a relatively large number of check words are required to achieve a desired level of security against errors. As all such check words are additional to the data words, and therefore in a sense redundant, more sophisticated methods of generating the check words which result in an improved error detection and correction capability without undue increase in the number of check words required are in use particularly for digital television signals where the amount of data involved means that even without the addition of redundant words very high bit rates have to be used. Examples of more sophisticated methods which have been used for digital television signals are various so-called b-adjacent codes of which the Reed-Solomon code is a particular example, and the Bose-Chaudhuri-Hocquenghem code.

A common problem with prior methods of error detection and correction using check words is that if an error occurs in a check word, for example, during transmission or during recording and reproduction, this may mean that error detection and correction using that check word is impossible or alternatively wrong error detection and correction may occur. In the case of a digital television signal either of these eventualities may result in serious deterioration of a produced television picture.

SUMMARY OF THE INVENTION

One object of the present invention is to provide a method of correcting errors in binary data in which this problem is alleviated.

Another objection of the present invention is to provide a method of correcting errors in binary data by deriving check words which are not only dependent on associated data words but also an other associated check words.

Another object of the present invention is to provide a method of correcting errors in binary data in which errors in check words can be detected and in some cases corrected.

According to the present invention there is provided a method of correcting errors in binary data, the method comprising associating with each block of data bits or data words a plurality of check bits or check words respectively for use in error detection and correction, each said check bit or check word being derived in dependence on all said data bits or data words respectively in said data block and each other said check bit or check word respectively associated with said data block.

The above, and other objects, features and advantages of this invention will be apparent from the following detailed description of illustrative embodiments which is to be read in connection with the accompanying drawings.

BRIEF DESCRIPTION OF THE PREFERRED EMBODIMENTS

To assist understanding of the invention some general theory of error correction coding and a known prior error correction code will first be discussed.

If one considers a sequence of binary digits, then an error can be sufficiently identified merely by its position. Thus if the position of the error bit is known, the required correction is known because the bit can only have two values and the correct value must be the inverse of the actual value. If one considers a block of data words, that is a plurality of data words each consisting of a plurality of bits, then to identify an error sufficiently the position and the magnitude of the error need to be known.

Figure 1:
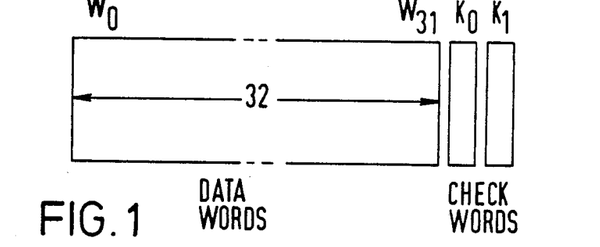
FIG. 1 indicates diagrammatically a block of data words with associated check words in a prior method.

Referring to FIG. 1, consider now a block a say thirty-two 8-bit data words $W_0$ to $W_{31}$. Each of the data words $W_0$ and $W_{31}$ may represent in pulse code modulated form a sample level of an analog television signal, the sample range having 256 steps, that is $2^8$. Associated with the block are two 8-bit check words $K_0$ and $K_1$ to provide error correction of one 9-bit data word, by identifying the position of the word in error and the magnitude of the error. This might be considered as providing two simultaneous equations which are solved to find the two unknowns. For this to be possible the two check words must each be derived in dependence on all the data words in the block, but in different ways, so as to ensure that they include independent information and hence the equations are soluble. A Reed-Solomon code, which is a form of so-called b-adjacent code, is one way of obtaining this independence.

Figure 6A:
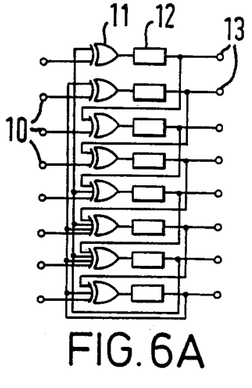
FIGS. 6A to 6F show in block form respective primitive polynomial generators for use in the method of FIG. 5.
Figure 6B:
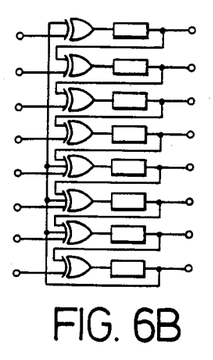
Figure 6C:
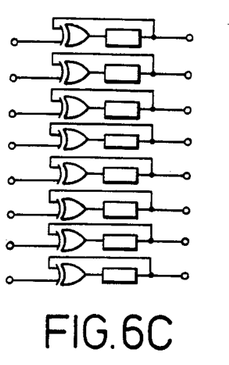

Thus in the example of FIG. 1, the first check word $K_0$ is derived by the simple modulo-2 addition of all 32 data words. That is:

$$K_0 = W_0 \oplus W_1 \oplus W_2 \oplus \ldots \oplus W_{31} \quad (1)$$

where $\oplus$ represents modulo-2 addition, also known as exclusive-OR addition, achieved by the circuit of FIG. 6C.

Figure 6D:
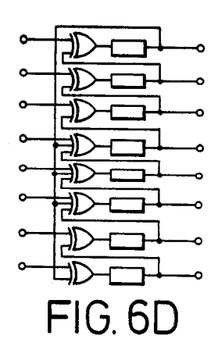
Figure 6E:
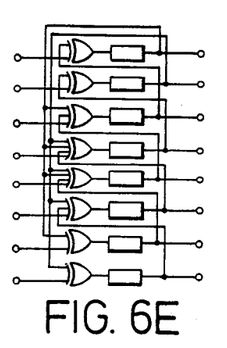
Figure 6F:
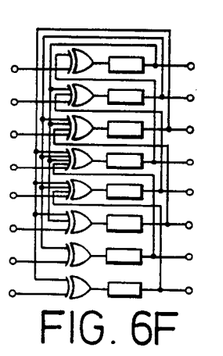

The second check word $K_1$ is derived using a primitive polynomial generator. Consider FIG. 2. The centre of the circle represents the 8-bit word 00000000. Around the circumference of the circle are 255 steps designated $\alpha^0, \alpha^1, \alpha^2, \ldots \alpha^{254}$. The effect of the polynomial generator, which is conveniently formed as an 8-stage feedback shift register interconnected as shown in FIG. 6D, is to step an input data word clockwise around the circle. Thus if an 8-bit data word is stored in the shift register, the word may be considered as having been multiplicity by $\alpha^0$, that is by one. If the shift register is then clocked once the word may be considered as having been multiplied by $\alpha^1$, and so on up to $\alpha^{254}$. One further clock brings the data word back to the original value. Because the polynomial is primitive any input 8-bit combination other than 00000000 supplied to the shift register will cycle in a predetermined manner through all the other possible combinations before returning to the original combination.

To derive the check word $K_1$, the data word $W_0$ is supplied to the inputs of the shift register, which is then clocked once. The data word $W_1$ is modulo-2 added and the shift register is clocked once again. The data word $W_2$ is modulo-2 added and the shift register is clocked once again. This is continued until finally the data word $W_{31}$ is modulo-2 added. The first few steps can be represented as follows:

$$(W_0 \cdot \alpha^1) \oplus W_1 \quad (2)$$

$$((W_0 \cdot \alpha^1 \oplus W_1)\alpha^1 \oplus W_2 \quad (3)$$

$$((W_0 \cdot \alpha^1 \alpha W_1)\alpha^1 \oplus W_2)\alpha^1 \oplus W_3 \quad (4)$$

Expression (4) can be be-written:
$$W_0\alpha^3 \oplus W_1\alpha^2 \oplus W_2\alpha^1 \oplus W_3\alpha^0 \quad (5)$$

Finally therefore we have:

$$K_1 = W_0\alpha^{31} \oplus W_1\alpha^{30} \oplus W_2\alpha^2 \oplus \ldots \oplus W_{31}\alpha^0 \quad (6)$$

In matrix form equations (1) and (6) can be written:

$$\begin{bmatrix} K_0 \\ K_1 \end{bmatrix} = \begin{bmatrix} \alpha^0 \alpha^0 \alpha^0 \ldots \alpha^0 \\ \alpha^0 \alpha^1 \alpha^2 \ldots \alpha^{31} \end{bmatrix} \begin{bmatrix} W_{31} \\ W_{30} \\ W_{29} \\ \vdots \\ W_0 \end{bmatrix} \quad (7)$$

The method of decoding used to derive from the check words $K_0$ and $K_1$ information as to the position and magnitude of an error will now be described. The general method of decoding is applicable not only to the coding method described immediately above, but also with some modifications to those to be described below, including coding methods in accordance with the invention. If it is assumed that one of the data words $W_x$ is in error, for example after the block of data words $W_0$ to $W_{31}$ with the two associated check words $K_1$ and $K_1$ have been recorded and reproduced, then the error $E_x$ can be taken as being modulo-2 added to the recorded data word $W_x$ resulting in the reproduced error data word $W_x \oplus E_x$.

After reproduction, two syndromes $S_0$ and $S_1$ are generated. The syndrome $S_0$ is the modulo-2 sum of $K_0$; and $K'_0$ which is derived in a similar manner to $K_0$ but from the reproduced data. Therefore:

$$S_0 = (K_0) \oplus (K'_0) = \left\{ \sum_{n=0}^{31} W_n \right\} \oplus \left\{ \sum_{n=0}^{31} W_n \oplus E_x \right\} = E_x \quad (8)$$

Thus if there is no error ($E_x \times 0$), the syndrome $S_0$ will be zero and if there is an error ($E_x \neq 0$), the syndrome $S_0$ is equal to the magnitude of the error $E_x$.

The syndrome $S_1$ is the sum of $K_1$; and $K'_1$ which is derived in a similar manner to $K_1$ but from the reproduced data words. Therefore:

$$S_1 = (K_1) \oplus (K'_1) = \quad (9)$$

$$\left\{ \sum_{n=0}^{31} W_n \alpha^{31-n} \right\} \oplus \left\{ \sum_{n=0}^{31} W_n \alpha^{31-n} \oplus E_x \cdot \alpha^{31-x} \right\} = E_x \cdot \alpha^{31-x}$$

Figure 2:
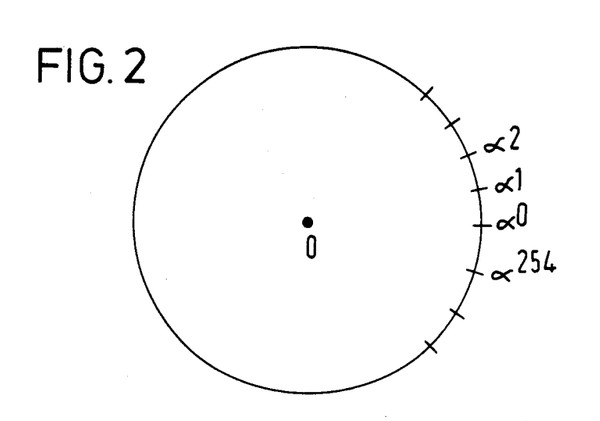
FIG. 2 illustrates diagrammatically the operation of a primitive polynomial generator.

Thus if there is no error ($E_x = 0$) the syndrome $S_1$ will be zero and if there is an error ($E_x \neq 0$), the syndrome $S_1$ is equal to the magnitude of the error $E_x$ stepped back to the position of the error, that is by 31-x steps, around the circle of FIG. 2.

Thus if the syndrome $S_1$ is stepped back x−31 steps it will become equal to the magnitude of the error $E_x$, that is, equal to the syndrome $S_0$:

$$S'_1 = S_1 \cdot \alpha^{x-31} = E_x \cdot \alpha^0 = S_0 \quad (10)$$

To find the position of the error data word $W_x$, a Chien search is performed in which $S_1$ is repeatedly multiplied by $\alpha^{-1}$, that is it is stepped successively around the circle of FIG. 2 in an anti-clockwise direction, testing for $S'_1 = S_0$ at each step. When this condition is satisfied the position of the error has been found.

As a modification to the latter part of this method the syndrome $S_1$ can initially be multiplied by $\alpha^{--}$. Thus equation (9):

$$S_1 = Ex \cdot \alpha^{--x} \qquad (9)$$

is modified to give a new syndrome $S$, where:

$$S_1 = Ex \cdot \alpha^{-x} \qquad (10')$$

The Chien search can then be repeatedly performed by multiplying by $\alpha^1$ and testing for $S_1 = S_0$ at each step. The advantages of this modification are that it avoids the need for reverse stepping, so a primitive polynomial generator of the same configuration as used in the coder can be used, and it requires only one delay store, rather than two first-in last-out stores.

The above-described error correcting code will correct a single error without fall. Thus if the error is in one of the data words $W_0$ to $W_{31}$, the check words $K_0$ and $K_1$ will enable the magnitude and the position of the error to be determined. Moreover, if the error is in one of the check words $K_0$ and $K_1$, then one of the syndromes $S_0$ and $S_1$ will be zero and the other will be non-zero, thus indicating that the error is in one of the check words $S_0$ and $S_1$ and the data words $W_0$ and $W_{31}$ are error-free.

However, it will be seen that problems arise with this error correcting code in all cases where there are multiple errors, that is two or more errors. In such cases it would be advantageous if the error correcting code at least had some error detecting capability even in the cases where it could not effect error correction. Also in such cases it is important to reduce the probability of failure, that is where in the presence of two or more errors a wrong correction is made resulting in data which is in fact valid being invalidated. For a perfect code, an example of which is the single error correcting Hamming mode, the number of addresses identifiable by the check words is equal to the number of addresses where an error may occur. Inevitably therefore it there is more than one error, the Hamming code will assume a single error and make a wrong correction. For non-perfect codes, it is desirable to use that part of the code which is not used for correction as a means of detecting as best possible all error patterns outside this information requirement of the code.

The code described above with reference to FIG. 1 is not perfect in this sense because the two syndromes $S_0$ and $S_1$ can assume $2^{16} - 1$ different non-zero patterns whereas the total possible number of error patterns is $2^8 - 1$, that is 255 (the number of possible word patterns) times 34 (the number of words). Clearly:

$2^{16} - 1$ is greater than 255 times 34 and this would still be true if the total number of words including the check words were increased to the maximum possible 255. This means that in theory at least some of the residual patterns are available for detection of multiple errors involving more than a single word.

To achieve this it is necessary to ensure that as many possible of these residual patterns do not occur in correcting single errors.

By calculating the probabilities of failure associated with multiple errors it becomes apparent that the most troublesome situation is where there is an error in a check word, as in that case the code cannot distinguish whether this represents a single error in the check word or a multiple error in the data words. If the system assumes that it is a single error in the check word, then there is a significant probability of a data word block containing at least two errors being passed as valid, while if the system assumes that there is are two errors in the data block there is a significant probability of valid data word blocks being treated as invalid. The particular difficulty with errors in check words is that the other check word cannot give any information concerning the error, because the two check words are not related to each other in any way except through the data words.

A simple error correcting code according to the invention will be described with reference to FIG. 3. As with FIG. 1, this shows a block of thirty-two 8-bit data words $W_0$ and $W_{31}$. Associated with the block are two 8-bit check words $C_0$ and $C_1$. Basically these check words $C_0$ and $C_1$ are derived in the same way as the check words $K_0$ and $K_1$ of FIG. 1.

That is, the check word $C_0$ is formed as a modulo-2 sum and the ckeck word $C_1$ is formed using a primitive polynomial generator, but whereas the check words $K_0$ and $K_1$ of FIG. 1 are both in effect related to the position 31 in the block, the check words $C_0$ and $C_1$ are in effect related to the position 33. In other words, whereas the check words $K_0$ and $K_1$ of FIG. 1 are derived in dependence on the data words up to and including the last data word $W_{31}$ in this position 31, the check words $C_0$ and $C_1$ of FIG. 3 are derived in dependence on the data words up to and including the last data word $W_{31}$ in the position 31 plus the check words $C_0$ and $C_1$ themselves in the positions 32 and 33.

Thus each of the check words $C_0$ and $C_1$ contains information concerning the other check word, so that in decoding, the check words $C_0$ and $C_1$ can be treated exactly as if they were data words, and if there is a single error the magnitude and position of the error can be determined even if the error is in one of the check words $C_0$ or $C_1$.

The problem, of course, is to generate the check words $C_0$ and $C_1$, and this is probably best explained mathematically. Equations (1) and (6) show how the check words $K_0$ and $K_1$ of FIG. 1 could be derived from the data words $W_0$ to $W_{31}$:

$$K_0 = W_0 \oplus W_1 \oplus W_2 \oplus \ldots \oplus W_{31} \qquad (1)$$

$$K_1 = W_0\alpha^{31} \oplus W_1\alpha^{30} \oplus W_2\alpha^{29} \oplus \ldots \oplus W_{31}\alpha^0 \qquad (6)$$

Figure 3:
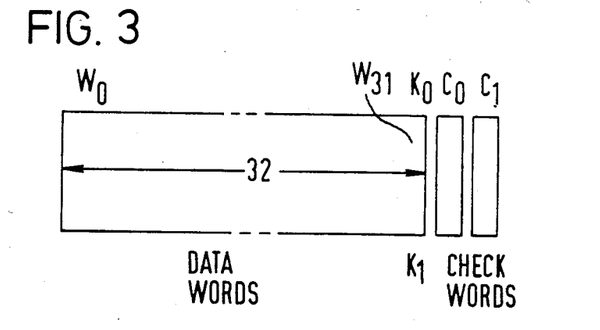
FIG. 3 indicates diagrammatically a further block of data words with associated check words in a method according to the invention.

Thus in the situation of FIG. 3, given the thirty-two data words $W_0$ to $W_{31}$, two intermediate words $K_0$ and $K_1$ related to the position 31 can be derived. Moreover, from FIG. 3 is will be seen that:

$$C_0 \cdot \alpha^0 = K_0 \alpha^0 \oplus C_1 \alpha^0 \qquad (11)$$

and $$C_1 \alpha^0 = K_1 \alpha^2 \oplus C_0 \alpha^1 \qquad (12)$$

Equations (11) and (12) can be re-written:

$$K_0 = C_0 \oplus C_1 \qquad (13)$$

and $$K_1 = C_0 \alpha^{-1} \oplus C_1 \alpha^{-2} \qquad (14)$$

In matrix form this becomes:

$$\begin{bmatrix} K_0 \\ K_1 \end{bmatrix} = \begin{bmatrix} \alpha^0 & \alpha^0 \\ \alpha^{-1} & \alpha^{-2} \end{bmatrix} \begin{bmatrix} C_0 \\ C_1 \end{bmatrix} \qquad (15)$$

The centre matrix is in fact a Vandemonde determinant, so it always has a real inverse, and equation (15) can be solved for $C_0$ and $C_1$. In fact the solution when employing a primitive polynomial generator of the form shown in FIG. 6D represented by the equation:

$$X^8 = X^4 \oplus X^3 \oplus X^2 \oplus X^0 \qquad (16)$$

is:

$$\begin{bmatrix} C_0 \\ C_1 \end{bmatrix} = \begin{bmatrix} \alpha^{230} & \alpha^{232} \\ \alpha^{231} & \alpha^{232} \end{bmatrix} \begin{bmatrix} K_0 \\ K_1 \end{bmatrix} \qquad (17)$$

so the required check words $C_0$ and $C_1$ can readily be determined, most conveniently by using a programmable read-only memory (PROM) as a lock-up table.

Figure 4:
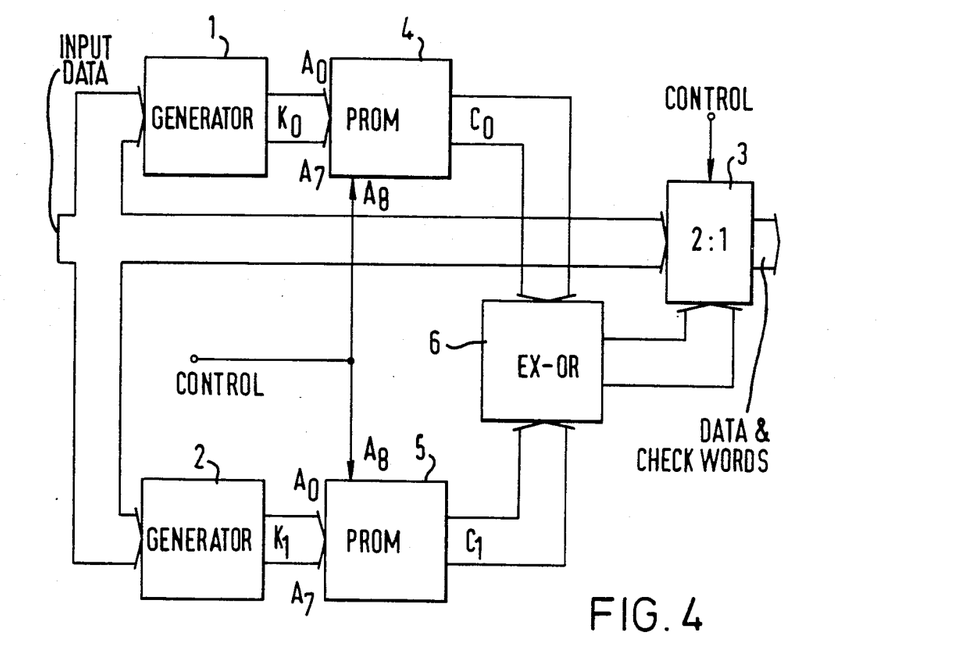
FIG. 4 shown in block form a circuit for generating check words in a method according to the invention.

FIG. 4 shows in block schematic form a circuit for generating the check words $C_0$ and $C_1$. The incoming data words $W_0$ and $W_{31}$ are supplied to first and second primitive polynomial generators 1 and 2 which derive the intermediate words $K_0$ and $K_1$ respectively, and also to a 2:1 selector 3. The intermediate word $K_0$ derived by the primitive polynomial generator 1 is supplied to a (512×8) PROM 4 and the intermediate word $K_1$ derived by the primitive polynomial generator 2 is supplied to a (512×8) PROM 5. The intermediate words $K_0$ and $K_1$ are supplied to the input terminals $A_0$ and $A_7$ of the PROMs 4 and 5 respectively and to the input terminals $A_8$ are supplied switching signals to cause the PROMs 4 and 5 to operate alternately to derive the check words $C_0$ and $C_1$, which are supplied by way of an exclusive. - OR circuit 6 of the 2:1 selector 3. The output of the 2:1 selector 3 is formed by the data words $W_0$ and $W_{31}$ with the associated check words $C_0$ and $C_1$.

In the decoder the procedure is basically as described above for the prior method of FIG. 1 but with the difference that instead of deriving the check words merely from the incoming data words, both the incoming data words and the incoming check words are used, and in consequence the syndromes are derived directly. If there are no errors in the check words then both syndromes are zero. If both the syndromes are non-zero then there is a single error, and the magnitude and position of this error can be found by a Chien search. It may be, of course, that this Chien search reveals the the single error is in one of the check words, in which case the data words are simply passed as valid, with no correction being necessary. If one syndrome is zero and the other is non-zero, then there is more than one error.

Figure 5:
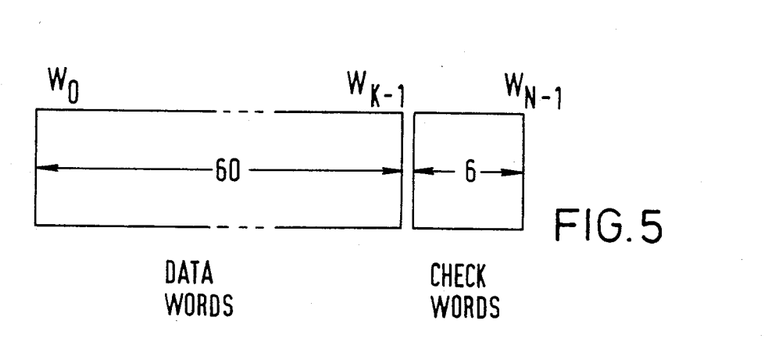
FIG. 5 indicates diagrammatically a still further block of data words with associated check words in a further method according to the invention.

The example which has just been given is of course a very simple one, and a more practical example will now be given with reference to FIGS. 5 to 8. FIG. 5 indicates diagrammatically a block of sixty data words $W_0$ to $W_{59}$ ($W_{K-1}$), with which are associated six check words. The method is for use in a digital video tape recorder and the data words are 8-bit code modulated words corresponding to sample levels of an analog television signal. The use of six check words with sixty data words gives a level of redundancy which has been used in several prior methods, but the number of data words could be different, so long as the number lies within the range 1 to 249 inclusive.

Basically the data with the six associated check words form a modified 3-error correcting Reed-Solomon code. It is not required to use the full 3-error correcting capability to correct errors within the block and the associated check words, and this capability may be used merely to correct one or two errors in the data and the associated check words, the remaining redundancy being exploited for error detection, for example to implement a block parity check on a array of data comprising several such blocks.

In a conventional Reed-Solomon code the six check words would be derived from the matrix of extension field elements as follows:

$$\begin{bmatrix} K_0 \\ K_1 \\ K_2 \\ K_3 \\ K_4 \\ K_5 \end{bmatrix} = \begin{bmatrix} \alpha^0 & \alpha^0 & \alpha^0 & \ldots \\ \alpha^0 & \alpha^1 & \alpha^2 & \ldots \\ \alpha^0 & \alpha^2 & \alpha^4 & \ldots \\ \alpha^0 & \alpha^3 & \alpha^6 & \ldots \\ \alpha^0 & \alpha^4 & \alpha^8 & \ldots \\ \alpha^0 & \alpha^5 & \alpha^{10} & \ldots \end{bmatrix} \begin{bmatrix} W_{K-1} \\ W_{K-2} \\ W_{K-3} \\ \cdot \\ \cdot \\ \cdot \\ W_0 \end{bmatrix} \qquad (18)$$

where $K_0$ to $K_5$ represents the six check words respectively, and $W_0$ to $W_{k-1}$ represent the data words. In practice, however, it may be simpler from the hardware point of view to use the following matrix:

$$\begin{bmatrix} K_{-2} \\ K_{-1} \\ K_0 \\ K_1 \\ K_2 \\ K_3 \end{bmatrix} = \begin{bmatrix} \alpha^0 & \alpha^{-2} & \alpha^{-4} & \ldots \\ \alpha^0 & \alpha^{-1} & \alpha^{-2} & \ldots \\ \alpha^0 & \alpha^0 & \alpha^0 & \ldots \\ \alpha^0 & \alpha^1 & \alpha^2 & \ldots \\ \alpha^0 & \alpha^2 & \alpha^4 & \ldots \\ \alpha^0 & \alpha^3 & \alpha^6 & \ldots \end{bmatrix} \begin{bmatrix} W_{K-1} \\ W_{K-2} \\ W_{K-3} \\ \cdot \\ \cdot \\ \cdot \\ W_0 \end{bmatrix} \qquad (19)$$

The check words $K_{-2}$ to $K_3$ can be generated from the data words $W_0$ to $W_{K-1}$ using primitive polynomial generators as referred to above. The particular primitive polynomial generators required to generate the check words $K_{-2}$ to $K_3$ respectively are illustrated in block diagrammatic form in FIGS. 6A to 6F respectively. Looking, for example, at FIG. 6A, each of the primitive polynomial generators comprising eight input terminals 10 each connected to one input of a respective exclusive-OR gate 11, the output of which is connected to the input of a respective shift register stage 12, each having an output connected to a respective output terminal 13. Feedback connections as appropriate to generate the required polynomial also extend from the outputs of the shift register stages 12 to respective inputs of the exclusive - OR gates 11.

Figure 7:
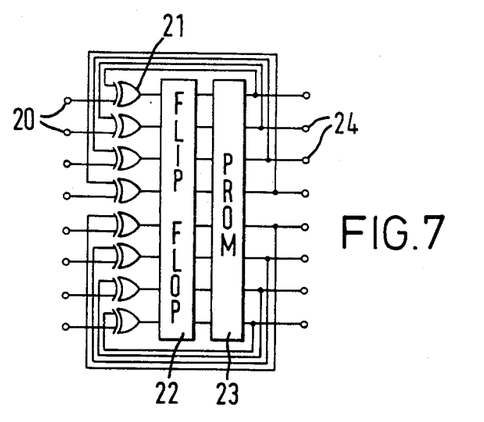
FIG. 7 shows in block form an alternative primitive polynomial generator for use in the method of FIG. 5.

As an alternative to using the six different polynomial generators shown in FIG. 6A to 6F respectively, a primitive polynomial generator incorporating a PROM as shown in block form in FIG. 7 can be used. This primitive polynomial generator comprises input terminals 20 each connected to one input of a respective exclusive-OR gate 21, the outputs of which are connected to an 8-way D-type flip-flop 22 having eight outputs respectively connected to eight inputs of a PROM 23 having eight outputs respectively connected to eight output terminals 24. Feedback connections also extend from the outputs of the PROM 23 to respective inputs of the exclusive-OR gates 21. The primitive polynomial which is actually generated by this primitive polynomial generator depends on the programming of the PROM 23, and the same basic configuration can therefore be used to form the six primitive polynomial generators required for generating the check words $K_{-2}$ to $K_3$.

In a conventional Reed-Solomon code, the check words $K_{-2}$ to $K_3$ would be associated with the data block with no further processing. However, as described above, this does not provide effective security against errors in the check words themselves, particularly where there is one error in a check word and one in a data word. As described above, therefore, the check words are modified so that each check word is dependent not only on all the data words but also on all of the other check words.

Then if K is the number of data words in the block and N is the block length, the first stage check words are generated from the following matrix:

$$\begin{bmatrix} K_{-2} \\ K_{-1} \\ K_0 \\ K_1 \\ K_2 \\ K_3 \end{bmatrix} = \begin{bmatrix} \alpha^0 & \alpha^{-2} & \alpha^{-4} & \ldots & \alpha^{-2(K-1)} \\ \alpha^0 & \alpha^{-1} & \alpha^{-2} & \ldots & \alpha^{-(K-1)} \\ \alpha^0 & \alpha^0 & \alpha^0 & \ldots & \alpha^0 \\ \alpha^0 & \alpha^1 & \alpha^2 & \ldots & \alpha^{(K-1)} \\ \alpha^0 & \alpha^2 & \alpha^4 & \ldots & \alpha^{2(K-1)} \\ \alpha^0 & \alpha^3 & \alpha^6 & \ldots & \alpha^{3(K-1)} \end{bmatrix} \begin{bmatrix} W_{K-1} \\ W_{K-2} \\ \vdots \\ \vdots \\ W_1 \\ W_0 \end{bmatrix} \quad (20)$$

In other words, $K_{-2}$ to $K_3$, are the check words which would conventionally be associated with the block. If we now define the check words which are actually to be used as $C_{-2}$ to $C_3$ then the check words C and K are related by the following equations:

$$\alpha^{-10}C_{-2} = \alpha^{-12}K_{-2} \oplus \alpha^{-8}C_{-1} \oplus \alpha^{-6}C_0 \oplus \alpha^{-4}C_1 \oplus \alpha^{-2}C_2 \oplus \alpha^0C_3 \quad (21)$$

$$\alpha^{-4}C_{-1} = \alpha^{-6}K_{-1} \oplus \alpha^{-5}C_{-2} \oplus \alpha^{-3}C_0 \oplus \alpha^{-2}C_1 \oplus \alpha^{-1}C_2 \oplus \alpha^0C_3$$

$$\alpha^0C_0 = \alpha^0K_0 \oplus \alpha^0C_{-2} \oplus \alpha^0C_{-1} \oplus \alpha^0C_1 \oplus \alpha^0C_2 \oplus \alpha^0C_3$$

$$\alpha^2C_1 = \alpha^6K_1 \oplus \alpha^5C_{-2} \oplus \alpha^4C_{-1} \oplus \alpha^3C_0 \oplus \alpha^1C_2 \oplus \alpha^0C_3$$

$$\alpha^2C_2 = \alpha^{12}K_2 \oplus \alpha^{10}C_{-2} \oplus \alpha^8C_{-1} \oplus \alpha^6C_0 \oplus \alpha^4C_1 \oplus \alpha^0C_3$$

$$\alpha^0C_3 = \alpha^{18}K_3 \oplus \alpha^{15}C_{-2} \oplus \alpha^{12}C_{-1} \oplus \alpha^9C_0 \oplus \alpha^6C_1 \oplus \alpha^3C_2$$

The equations (21) must be solved for the check words $C_{-2}$ to $C_3$. The equations can be rearranged in determinate form as follows:

$$\begin{bmatrix} K_{-2} \\ K_{-1} \\ K_0 \\ K_1 \\ K_2 \\ K_3 \end{bmatrix} = \begin{bmatrix} \alpha^2 & \alpha^4 & \alpha^6 & \alpha^8 & \alpha^{10} & \alpha^{12} \\ \alpha^1 & \alpha^2 & \alpha^3 & \alpha^4 & \alpha^5 & \alpha^6 \\ \alpha^0 & \alpha^0 & \alpha^0 & \alpha^0 & \alpha^0 & \alpha^0 \\ \alpha^{-1} & \alpha^{-2} & \alpha^{-3} & \alpha^{-4} & \alpha^{-5} & \alpha^{-6} \\ \alpha^{-2} & \alpha^{-4} & \alpha^{-6} & \alpha^{-8} & \alpha^{-10} & \alpha^{-12} \\ \alpha^{-3} & \alpha^{-6} & \alpha^{-9} & \alpha^{-12} & \alpha^{-15} & \alpha^{-18} \end{bmatrix} \begin{bmatrix} C_{-2} \\ C_{-1} \\ C_0 \\ C_1 \\ C_2 \\ C_3 \end{bmatrix} \quad (22)$$

Again, this is a Vandermonde determinant which always has a real inverse, and results in the following solution:

$$\begin{bmatrix} C_{-2} \\ C_{-1} \\ C_0 \\ C_1 \\ C_2 \\ C_3 \end{bmatrix} = \begin{bmatrix} \alpha^{227} & \alpha^{87} & \alpha^{140} & \alpha^{144} & \alpha^{99} & \alpha^{247} \\ \alpha^{84} & \alpha^{58} & \alpha^3 & \alpha^{72} & \alpha^{166} & \alpha^{103} \\ \alpha^{134} & \alpha^0 & \alpha^{253} & \alpha^{34} & \alpha^{76} & \alpha^{152} \\ \alpha^{135} & \alpha^{66} & \alpha^{31} & \alpha^2 & \alpha^{11} & \alpha^{152} \\ \alpha^{87} & \alpha^{157} & \alpha^{70} & \alpha^8 & \alpha^{70} & \alpha^{102} \\ \alpha^{232} & \alpha^{91} & \alpha^{143} & \alpha^{146} & \alpha^{100} & \alpha^{247} \end{bmatrix} \begin{bmatrix} K_{-2} \\ K_{-1} \\ K_0 \\ K_1 \\ K_2 \\ K_3 \end{bmatrix} \quad (23)$$

Figure 8:
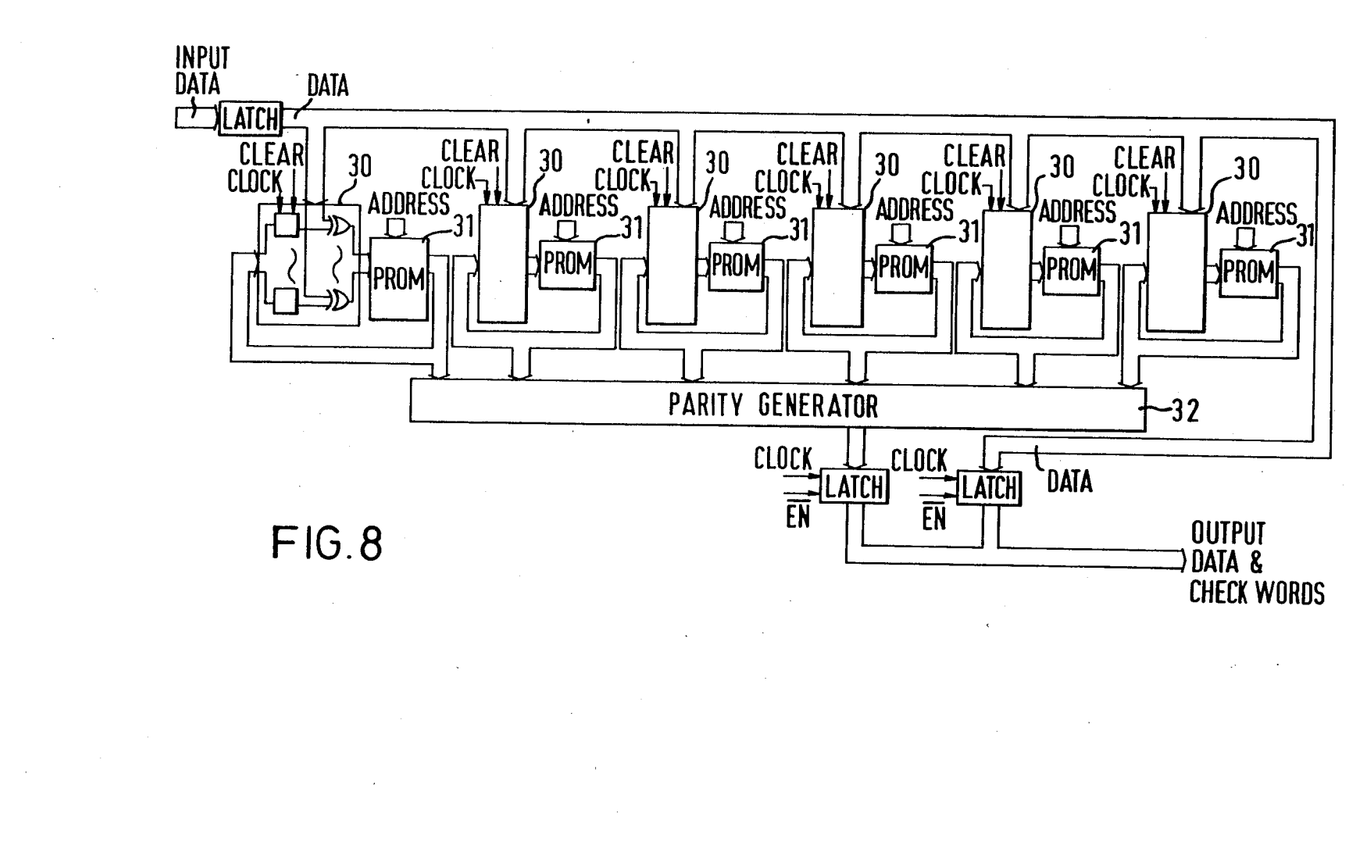
FIG. 8 shows in block form a code generator for use in the method of FIG. 5.

The implementation of this determinant is, in practice, made simple by the availability of large PROMs. The requirement in the particular case is 2K by 8, that is, 11 address inputs and 8 outputs. The block diagram of the complete code generator is shown in FIG. 8. Each of the check words $K_{-2}$ to $K_3$ is generated in the conventional manner using related primitive polynomial generators 30 as described above. Only the data words are used in this generation process. The output of each primitive polynomial generator 30 addresses a 6-way 8 to 8 code converter in the form of a 2K by 8

PROM 31, the outputs of which are connected to a parity generator 32. For each check word, one of the 8 to 8 code converter tables is accessed and the check word generated as a modulo-2 sum of all siz modified "K" check word values. The check words $C_{-2}$ to $C_3$ so generated are associated with the data block for transmission or recording.

The method of decoding at the decoder is generally as described above in connection with the method using only two check words.

Although the methods in accordance with the invention have been described in relation to b-adjacent and Reed-Solomon codes, the methods have general application to any method of coding in which check bits or check words are derived for association with a block of data bits or data words, and each check bit or check word is dependent only on all the data bits or data words in the block, such as a Bose-Chaudhuri-Hocquenghem code for correcting two or more errors.

Also, although the methods have been described in relation to digital television signals, it will readily be appreciated that the methods are also applicable to other forms of data, such as audio data.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A method block encoding binary data arranged in a data block of data words for later detection and correction of multiple word errors introduced by a subsequent processing step, the method comprising the steps of: deriving for each said data block of data words at least two check words for use in said error detection and correction, said check words being derived in accordance with a procedure by which said check words in combination are indicative of the location and magnitude of said introduced errors, each said check word being derived in dependence on all said data words in said data block and on all of the others of said check words derived for said data block; and association said check words with said data block.

2. A method according to claim 1, wherein one of said check words is derived by modulo-2 addition.

3. A method according to claim 1, wherein at least one of said check words is derived by a primitive polynomial generator using a function of an extension field of a common generator polynomial.

4. A method according to claim 3 wherein one of said check words is derived by modulo-2 addition and the remaining said check words are derived by respective primitive polynomial generators, each using a respective function of an extension field of a common generator polynomial.

5. A method according to claim 1, wherein said check words are derived using a b-adjacent code.

6. A method according to claim 1, wherein said check words are derived using a Reed-Solomon code.

7. A method according to claim 1, wherein said check words are derived using a Bose-Chaudhuri-Hocquenghem code for correcting at least two errors.

8. A method according to claim 1, wherein six said check words are associated with said block to provide a three-error correcting capability, and the number of said data words in said block lies in the range 1 to 249, each said word being an 8-bit word.

9. A method according to claim 1, wherein said data words represent a pulse code modulated digital television signal.

10. A method according to claim 1, wherein a plurality of intermediate words corresponding to said check words, respectively, are derived in dependence on all said data words in said associated data block, and each said check word is derived in dependence on all of said corresponding intermediate words.

* * * * *